(12) United States Patent
Perez et al.

(10) Patent No.: US 6,385,051 B1
(45) Date of Patent: May 7, 2002

(54) CIRCUIT BOARD MOUNTING APPARATUS AND ASSOCIATED METHODS

(75) Inventors: Juan M. Perez, Tomball; Jeffrey A. Lambert, Houston; Donald J. Hall, Magnolia, all of TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/523,835

(22) Filed: Mar. 13, 2000

(51) Int. Cl.[7] ................................................. H05K 5/00
(52) U.S. Cl. ....................... 361/759; 361/726; 361/727; 361/752
(58) Field of Search ............................... 361/752, 753, 361/759, 801, 802, 725–728; 174/138 G, 138 D

(56) References Cited

U.S. PATENT DOCUMENTS

| | | | | |
|---|---|---|---|---|
| 5,191,513 A | * | 3/1993 | Sugiura et al. | 361/399 |
| 5,490,038 A | * | 2/1996 | Scholder et al. | 361/759 |
| 5,668,699 A | * | 9/1997 | Bell et al. | 361/753 |
| 5,691,504 A | * | 11/1997 | Sands et al. | 174/35 R |
| 5,754,396 A | | 5/1998 | Felcman et al. | 361/683 |
| 5,801,928 A | * | 9/1998 | Burstedt et al. | 361/801 |
| 5,973,926 A | * | 10/1999 | Sacherman et al. | 361/759 |
| 6,166,917 A | * | 12/2000 | Anderson | 361/756 |

* cited by examiner

*Primary Examiner*—Jayprakash N. Gandhi
*Assistant Examiner*—Tuan Dinh
(74) *Attorney, Agent, or Firm*—Fletcher, Yoder & Van Someren

(57) ABSTRACT

A screwless technique for mounting a circuit board in a computer chassis is provided in which circular portions of keyhole-shaped mounting openings in the circuit board body are first moved downwardly over notched chassis mounting bosses. The circuit board is then forwardly moved transversely to the bosses to move opening edge portions of the circuit board body into the boss notches in a manner releasably preventing the circuit board from being lifted off the bosses. A retaining bracket is placed adjacent a body edge of the installed circuit board to block the board against rearward releasing movement relative to the chassis bosses.

21 Claims, 5 Drawing Sheets

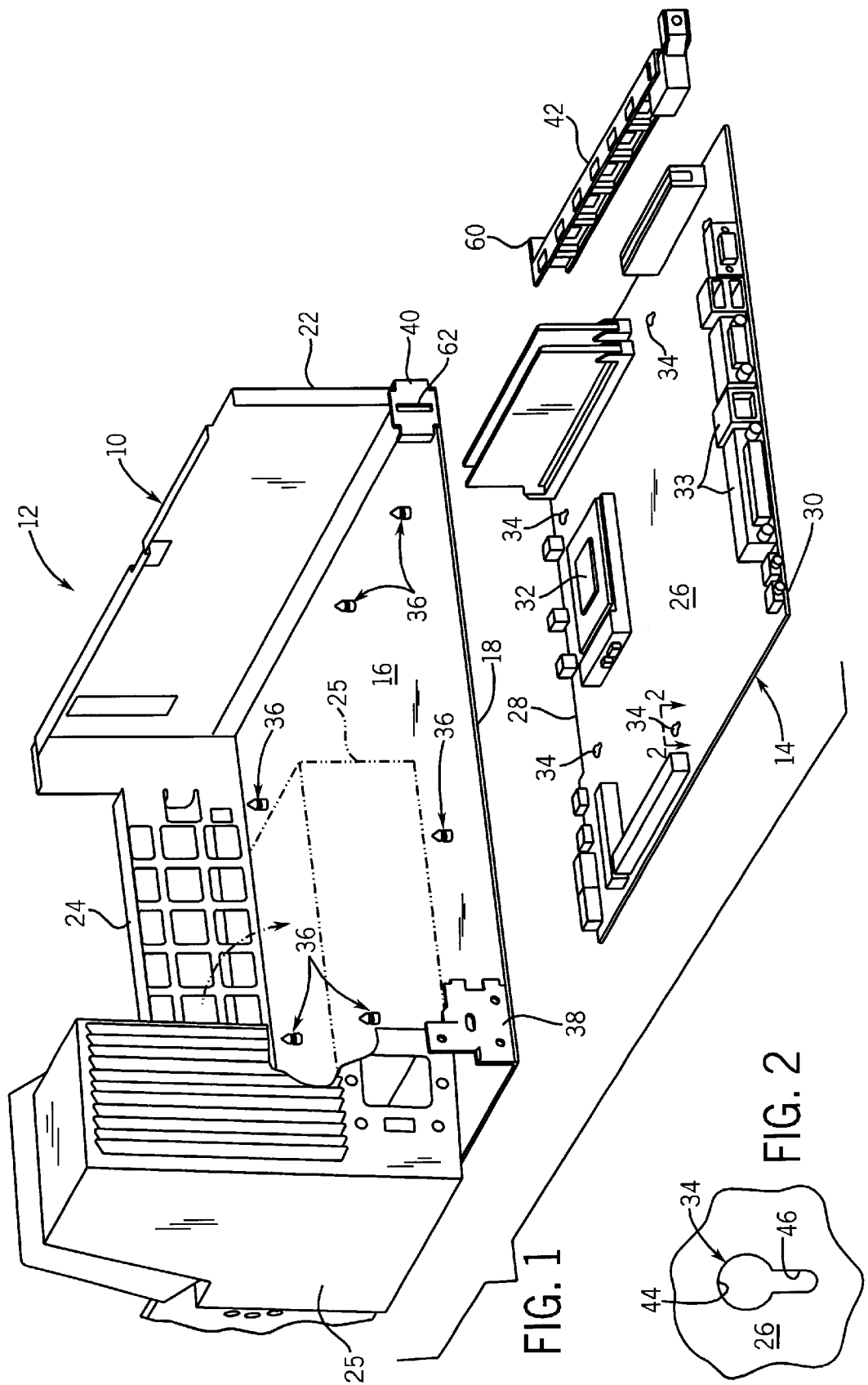

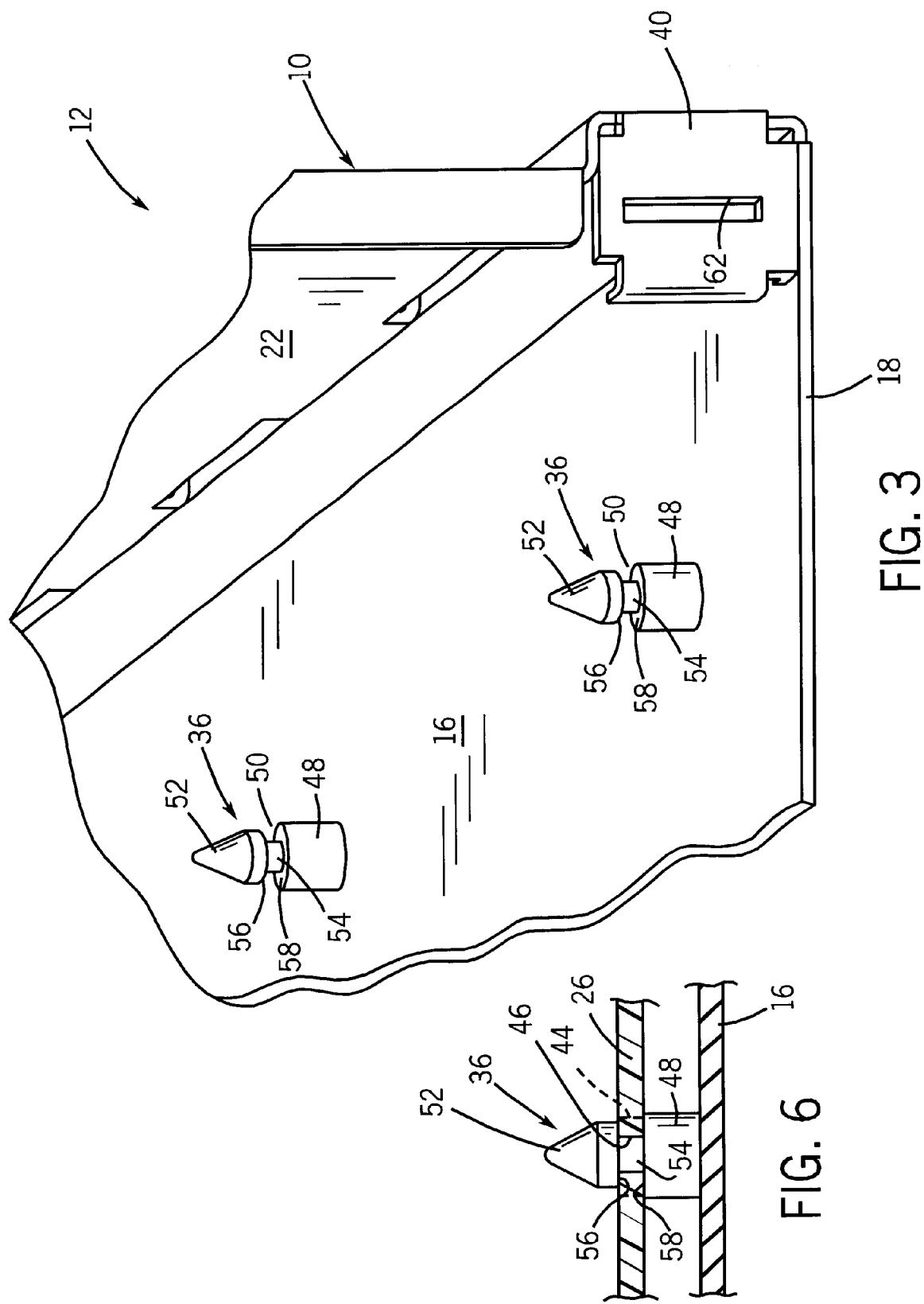

CIRCUIT BOARD MOUNTING APPARATUS AND ASSOCIATED METHODS

BACKGROUND OF THE INVENTION

1. Field of the Invention

The present invention generally relates to electronic apparatus and, in a preferred embodiment thereof, more particularly relates to apparatus and methods for operatively mounting circuit boards on support structures such as computer chassis walls.

2. Description of Related Art

For many years, the conventional method of installing a circuit board, such as the motherboard, in a computer was to simply screw the board substrate to bosses or other mounting structures suitably mounted on a chassis wall portion of the computer. This circuit board installation method substantially increased the time, and thus the cost, required to construct the computer in addition to adding to the complexity and difficulty of assembling, and later disassembling and servicing the computer.

A relatively recent improvement in the mounting of a main circuit board in a computer is illustrated and described in U.S. Pat. No. 5,754,396 to Felcman et al entitled "MODULAR DESKTOP COMPUTER HAVING ENHANCED SERVICEABILITY In the desktop computer illustrated and described in this patent, the motherboard is mounted on a tray structure which may be slid into and out of the computer chassis to install and later remove the motherboard for access and service purposes.

While this tray support concept hastens and reduces the cost associated with initially installing the motherboard in the chassis and subsequently removing the motherboard for service and replacement, it also increases the manufacturing cost of the computer since the motherboard must be produced and spared with this auxiliary support tray secured thereto.

It thus can be seen from the foregoing that it would be desirable to provide for the cost effective, screwless installation and removal of a circuit board within a computer without the necessity of securing to the computer an auxiliary support tray or other cost increasing mounting structure. It is to this design goal that the present invention is directed.

SUMMARY OF THE INVENTION

In carrying out principles of the present invention, in accordance with a preferred embodiment thereof, electronic apparatus is provided which is representatively in the form of a desktop computer. The computer has a circuit board, illustratively a motherboard, and a support structure, representatively a chassis wall. According to a key aspect of the present invention, the circuit board is operatively secured to the chassis wall without the use of screws or any sort of support tray secured to the circuit board.

Using a screwless Circuit board attachment technique of the present invention, cooperatively engaged locking structures are carried by the circuit board and the support structure. The cooperatively engaged locking structures releasably hold the circuit board on the support structure and permit removal of the circuit board from the support structure in response to sequential movement of the circuit board relative to the support structure in (1) a first direction and (2) a second direction transverse to the first direction. A retaining structure releasably blocks movement of the circuit board in the first direction relative to the support structure, thereby releasably retaining the circuit board on the support structure.

In a preferred embodiment of the screwless circuit board attachment apparatus, the openings have generally keyhole-shaped configurations and are formed in a substrate body portion of the circuit board, and the projections are carried on the chassis wall portion, extend partly through the substrate openings and have notch portions receiving opening edge portions of the substrate body portion.

To rapidly install the circuit board on the chassis wall projections, the substrate body openings are moved over outer end portions of the projections, and the substrate body is moved parallel to its plane to cause the opening edge portions to enter the notches on the projections and thereby block removal of the circuit board from the projections in a direction parallel to their lengths. A retaining bracket member is then moved into a position in which it blocks movement of the circuit board to move its opening edge portions out of the projection notches.

When it is later desired to remove the circuit board, the retaining bracket is simply moved away from its circuit board blocking position, the circuit board is moved transversely to the projections to remove its opening edge portions out of the projection notches, and the circuit board is lifted off the projections.

BRIEF DESCRIPTION OF THE DRAWINGS

FIG. 1 is a partially exploded rear side perspective view of a portion of a representative computer chassis and a motherboard installable in the chassis using unique screwless installation apparatus embodying principles of the present invention;

FIG. 2 is an enlarged scale top plan detail view of the dashed circle area "2" in FIG. 1 illustrating a keyhole-shaped mounting opening formed in the motherboard substrate body;

FIG. 3 is an enlarged scale perspective view of a rear corner portion of the chassis illustrating a pair of upwardly projecting mounting bosses on its bottom side wall, and a retaining bracket slot formed in the chassis;

FIG. 6 is an enlarged scale partially elevational cross-sectional view taken along line 6—6 of FIG. 4 and illustrating the manner in which the mounting bosses captively retain the motherboard in its installed orientation relative to the bottom chassis wall.

DETAILED DESCRIPTION

Figure 4:
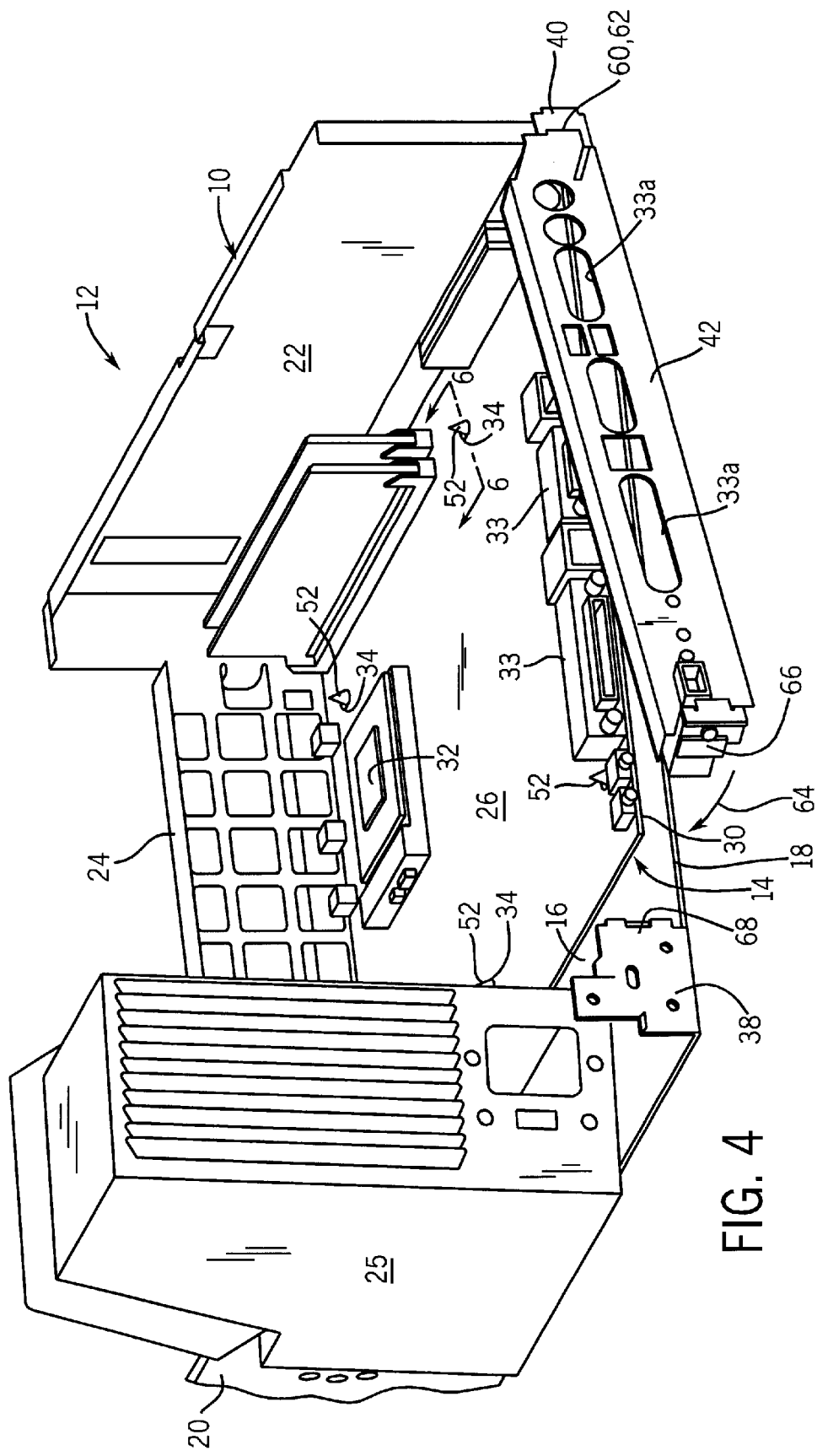
FIG. 4 is a rear side perspective view of the chassis with the motherboard mounted therein and a rear retaining bracket structure being secured to the chassis and ready to be pivoted forwardly to its board retaining position.

Perspectively illustrated in FIGS. 1, 3 and 4 is a bottom portion of a generally rectangular sheet metal chassis section 10 of a representative desktop computer 12 which also includes a main circuit board or "motherboard" 14.

Motherboard 14 is installable in the chassis 10 using unique screwless installation apparatus of the present invention as subsequently described herein. As will be readily appreciated by those of skill in this particular art, various computer components, such as drive units and other components and interconnecting cabling and the like have been removed from the chassis interior for purposes of illustrative clarity. Additionally, the top cover portion of the overall chassis structure has been removed for illustrative purposes.

Chassis 10 has a bottom wall 16 with a rear side edge 18, left and right upstanding side walls 20 and 22, and an upstanding front wall 24 extending between the side walls 20 and 22. An electrical power supply unit 25 of conventional construction is supported on the left side wall 20 for pivotal movement relative thereto between a solid line vertically extending access orientation, and a dashed line operating orientation in which the power supply unit 25 is swung down into the chassis interior in an upwardly spaced relationship with the bottom chassis wall 16.

The motherboard 14 has a generally planar rectangular substrate body 26 having front and rear side edges 28 and 30, with various electronic components, including a central processing unit 32, being operatively mounted on the top side of the substrate body 26. Also mounted on the substrate body 26, along its rear edge 30 are a series of various input/output components 33. Formed through the substrate body 26 are several spaced apart mounting holes 34 which form part of the specially designed circuit board mounting system of the present invention. The mounting system also includes spaced apart, upstanding mounting bosses 36 secured to the bottom chassis wall 16, upstanding left and right rear corner plate portions 38 and 40 of the chassis, and an elongated retaining bracket structure 42.

As best illustrated in FIG. 2, each of the motherboard substrate body mounting holes 34 is generally keyhole-shaped, having a circular main portion 44 from which a narrowed straight portion 46 radially outwardly projects. Each of the upwardly projecting mounting bosses (see FIG. 3) includes a cylindrical base portion 48, an annular, vertically intermediate notch 50, and a generally conically-shaped upper end portion 52. A reduced diameter intermediate cylindrical portion 54 vertically extends between the base portion 48 and the conical upper end portion 52, and annular upper and lower ledges 56,58 are formed by the notch 50.

To rapidly mount the motherboard 14 within the interior of the chassis 10, without the use of separate fasteners of any sort or securing a tray or other type of mounting structure to the motherboard, the motherboard 14 is simply placed above the bottom chassis wall 16, with the upstanding chassis mounting bosses 36 in alignment with the circular portions 44 of the substrate body holes 34 (see FIG. 2). Next, the motherboard 14 is lowered to cause the conical upper end portions of 52 of the mounting bosses 36 (see FIG. 3) to extend upwardly through the hole portions 44, and then forwardly shifted relative to the mounting bosses 36 to cause the vertically intermediate boss portions 54 to enter the narrowed radial substrate body hole portions 46, with the upper and lower annular boss portions 56,58 respectively overlying and underlying top and bottom side portions of the substrate body 26 as cross-sectionally illustrated in FIG. 6.

As described above, the substrate body 26, and thus the entire motherboard 14, are releasably locked to the bottom chassis wall 16 via the interlockable, or cooperatively engaged, locking assembly comprising the mounting holes 34 and the bosses 36.

The substrate body 26, and corresponding mounting holes 34, is disposed onto the bosses 36 in a manner such that, to remove the substrate body 26 from the bosses 36, the substrate body 26 must be moved rearwardly to remove the intermediate boss portions 54 from the radial hole portions 46, and then lifted to move the circular hole portions 44 upwardly past the upper conical boss portions 52 to free the substrate body 26 from the bosses 36.

Figure 5:
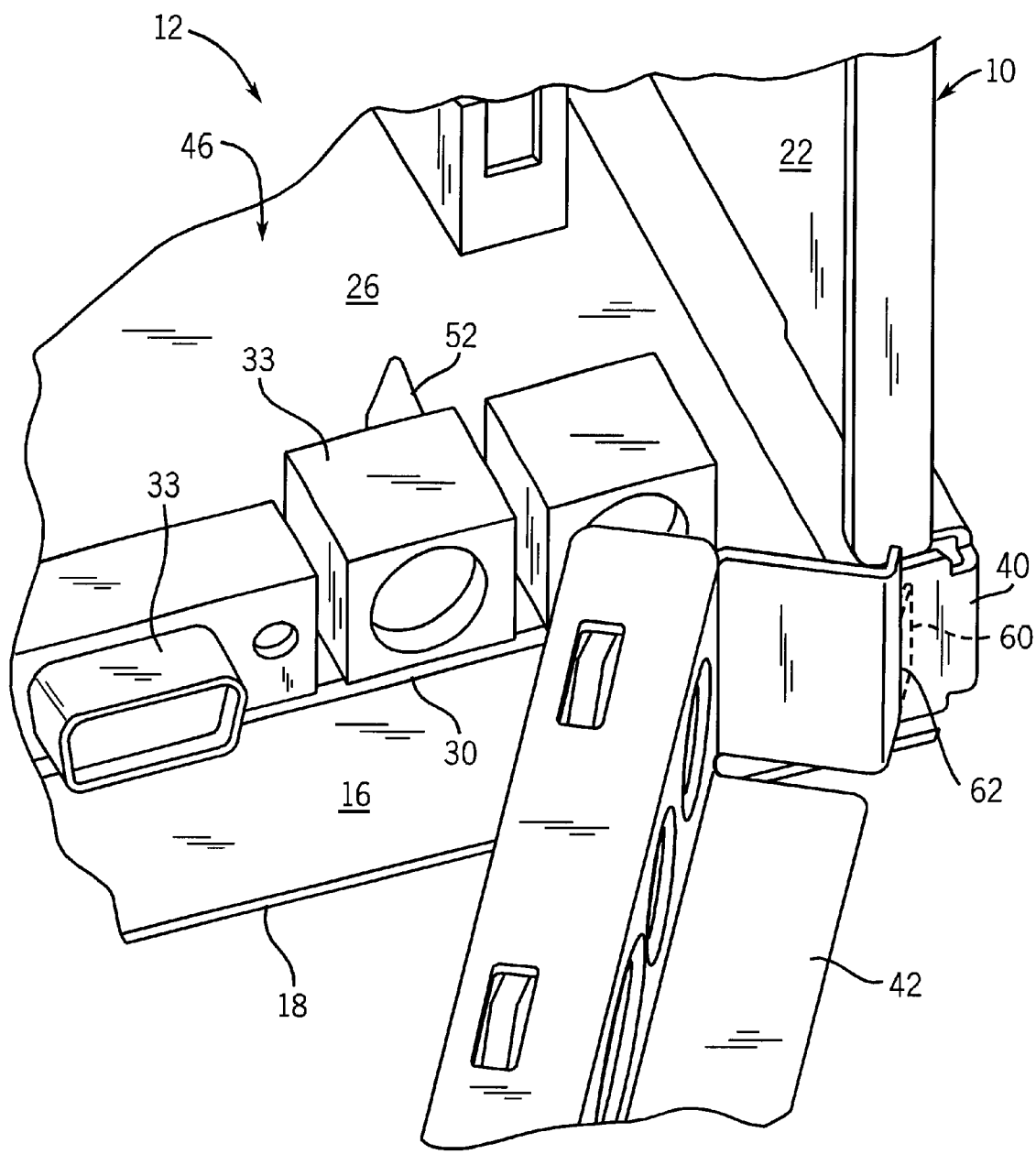
FIG. 5 is an enlarged scale perspective detail of a rear corner portion of the chassis illustrating the manner in which the retaining bracket structure is removably secured to the chassis.
Figure 7:
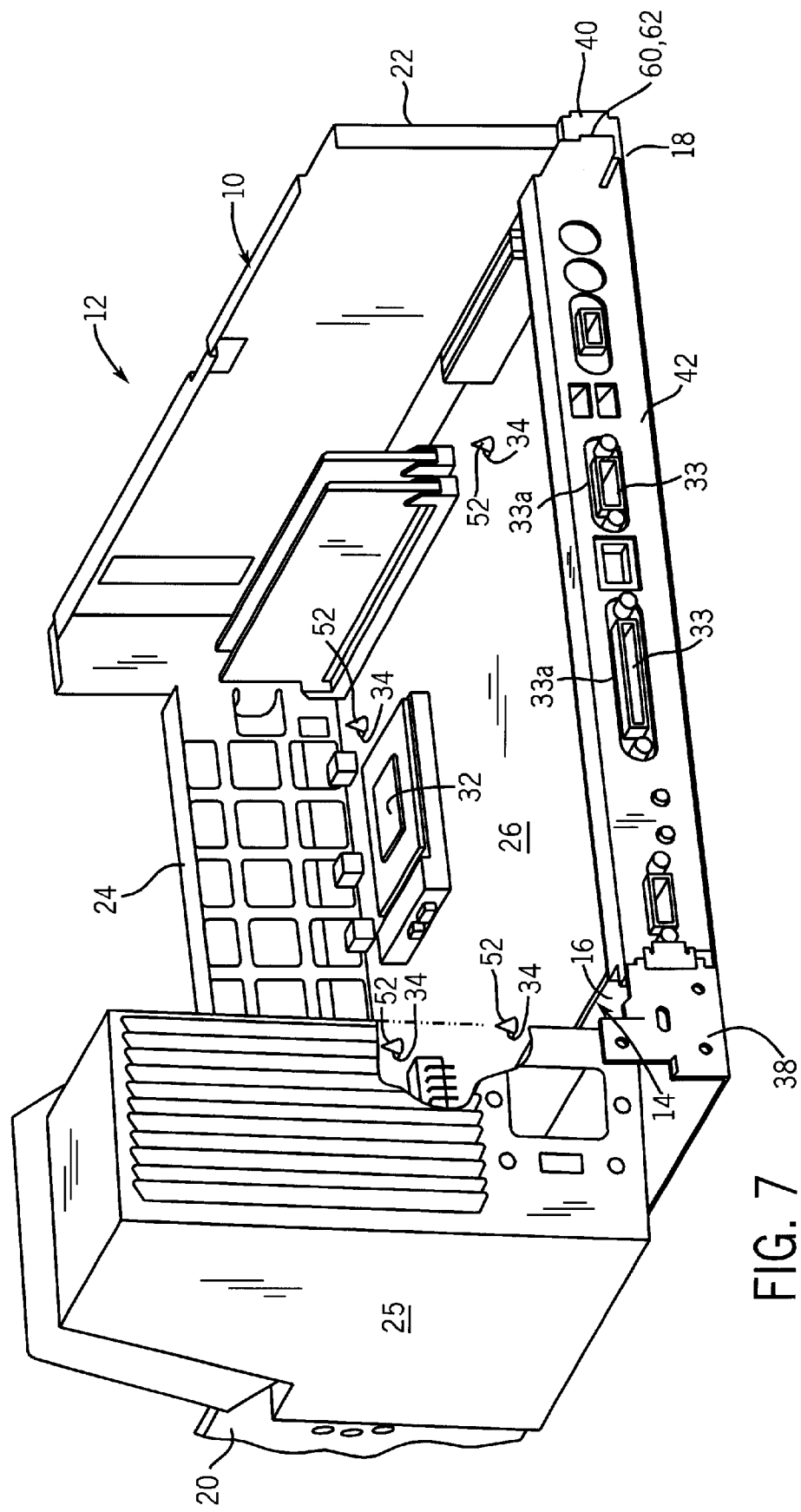
FIG. 7 is a rear side perspective view of the chassis illustrating the motherboard installed therein and captively retained within the chassis by the retaining bracket structure which has been swung inwardly to its locking position.

Such rearward shifting of the installed motherboard 14 relative to the bosses 36 is releasably prevented, thereby captively retaining the motherboard 14 on the bosses 36, using the retaining bracket 42. After the motherboard 14 is dropped onto and forwardly shifted relative to the bosses 36 as just described, a small outwardly projecting tab 60 on the right end of the retaining bracket 42 (see FIGS. 1, 4 and 5) is inserted into a vertical slot 62 formed in the right rear corner plate portion 40 of the chassis 10 (see FIGS. 1, 3 and 5). The retaining bracket 42 is then pivoted horizontally toward the rear edge 30 of the motherboard 14, as indicated by the arrow 64 in FIG. 4, until an outwardly projecting tab 66 on the left end of the retaining bracket 42 enters and is latchingly received in a vertical slot 68 in the left rear corner plate portion 38 of the chassis 10 (see FIG. 4). This releasably locks the retaining bracket 42 in its FIG. 7 installed position in which it extends outwardly along and parallel to the rear side edge 30 (see FIG. 4) of the motherboard substrate body 26.

With the retaining bracket 42 in this installed orientation, an inner or front side portion of the bracket defines an abutment which prevents the substrate body 26 from being rearwardly shifted in a manner unlocking it from and permitting it to be lifted off of the chassis bosses 36. Additionally, suitable openings 33a are formed in the bracket 42 that, with the bracket 42 in its installed orientation, complementarily receive rear portions of the various input/output devices as illustrated in FIG. FIG. 7.

When it is desired to remove the motherboard 14 from the chassis 10, the retaining bracket 42 is simply pivoted outwardly and removed from the chassis 10, thereby permitting the motherboard 14 to be rearwardly shifted relative to and lifted off the bosses 36 to quickly and easily remove the motherboard 14 from the computer 12.

As can readily be seen from the foregoing, the present invention provides for the screwless installation and removal of a circuit board on and from a support structure in an electronic device such as a computer, without the use of a support tray attached to the circuit board. While the present invention has been representatively illustrated as being used in conjunction with a computer motherboard attachable to a sheet metal chassis wall, it will be readily appreciated by those of skill in this particular art that principles of the invention could also be advantageously employed in an application involving other types of circuit boards attachable to other types of support structures.

Additionally, while the interlocking structures used on the circuit board to effect this screwless circuit board mounting representatively comprised projections on the support structure and cooperating openings on the circuit board, it will be readily be appreciated that the projections could alternatively be formed on the circuit board, and the cooperating openings associated with the support structure, if desired.

The foregoing detailed description is to be clearly understood as being given by way of illustration and example only, the spirit and scope of the present invention being limited solely by the appended claims.

What is claimed is:

1. An electronic apparatus comprising:
  a circuit board comprising an input/output port;
  a support structure for the circuit board;
  cooperatively engaged locking structures carried by said circuit board and said support structure, said locking structures releasably holding said circuit board on said support structure and permitting removal of the said circuit board from said support structure in response to sequential movement of said circuit board relative to said support structure in (1) a first direction and (2) a second direction transverse to said first direction; and a retaining structure blocking movement of said circuit board in said first direction relative to said support structure, wherein said retaining structure comprises a receptacle for an input/output port disposed on said circuit board.

2. The electronic apparatus of claim 1 wherein:

said cooperatively engaged locking structures include projections disposed on a first one of said circuit board and said support structure, and openings disposed on a remaining one of said circuit board and said support structure and lockingly receiving said projections.

3. The electronic apparatus of claim 2 wherein:

said first one is said support structure, and said remaining one is said circuit board.

4. The electronic apparatus of claim 3 wherein:

said circuit board has a generally planar substrate body portion, said openings have generally keyhole-shaped configurations, and said projections partially extend through said openings and have notch portions receiving opening edge portions of said substrate body portion.

5. The electronic apparatus of claim 4 wherein:

said electronic apparatus is a computer having a chassis portion with a wall, said circuit board is a motherboard, and said support structure is said chassis portion wall.

6. The electronic apparatus of claim 5 wherein:

said computer is a desktop computer.

7. The electronic apparatus of claim 1 wherein:

said retaining structure is releasably coupled with said support structure such that said retaining structure is movable away from said circuit board to an unblocked orientation thereto.

8. The electronic apparatus of claim 7 wherein said retaining structure is a retaining bracket pivotally coupled with said support structure.

9. The electronic apparatus of claim 1, wherein said retaining bracket comprises an input/output panel having said receptacle.

10. The electronic apparatus of claim 9, wherein said input/output panel comprises a plurality of receptacles for a plurality of input/output ports disposed on said circuit board.

11. The electronic apparatus of claim 9, wherein said retaining bracket is configured for abutting an edge of said circuit board to block said movement of said circuit board in said first direction.

12. The electronic apparatus of claim 9, wherein said cooperatively engaged locking structures comprise boss members interlockable with a constricted portion of slots for the boss members.

13. An electronic apparatus comprising:

a circuit board;

a support structure for the circuit board;

interlockable structures carried by said circuit board and said support structure, said interlockable structures comprising boss members interlockable with a constricted portion of slots for the boss members for releasably holding said circuit board on said support structure and permitting removal of said circuit board from said support structure in response to sequential movement of said circuit board relative to said support structure in (1) a first direction along the slots and (2) a second direction transverse to said first direction; and a retaining structure associatable with said support structure to block movement of said circuit board in said first direction relative to said support structure.

14. The electronic apparatus of claim 13 wherein:

said boss members are disposed on said circuit board, and said slots are disposed on said support structure.

15. The electronic apparatus of claim 13 wherein:

said boss members are disposed on said support structure, and said slots are disposed on said circuit board.

16. The electronic apparatus of claim 15 wherein:

said circuit board has a generally planar substrate body portion, said slots have generally keyhole-shaped configurations, and said boss members are partially extendable through said openings and have notch portions configured to receive opening edge portions of said substrate body portion defined by said slots.

17. The electronic apparatus of claim 16 wherein:

said electronic apparatus is a computer having a chassis portion with a wall, said circuit board is a motherboard, and said support structure is said chassis portion wall.

18. The electronic apparatus of claim 17 wherein:

said computer is a desktop computer.

19. The electronic apparatus of claim 13 wherein:

said retaining structure is releasably coupled with said support structure such that said retaining structure is movable toward and away from a blocking relationship with said circuit board.

20. The electronic apparatus of claim 19, wherein said retaining structure comprises a panel having a receptacle for an input/output component disposed on said circuit board.

21. The electronic apparatus of claim 20, wherein said panel defines a wall of said support structure.

* * * * *